United States Patent [19]

Hanson

[11] Patent Number: 5,777,312

[45] Date of Patent: Jul. 7, 1998

[54] PHASED ARRAY LASER SCANNER

[75] Inventor: George E. Hanson, Andover, Kans.

[73] Assignee: Norand Corporation, Cedar Rapids, Iowa

[21] Appl. No.: 589,214

[22] Filed: Jan. 22, 1996

Related U.S. Application Data

[63] Continuation of Ser. No. 339,972, Nov. 15, 1994, abandoned, which is a continuation of Ser. No. 53,080, Apr. 23, 1993, abandoned, which is a continuation-in-part of Ser. No. 23,901, Feb. 19, 1993, abandoned.

[51] Int. Cl.[6] ............................................. G06K 7/10
[52] U.S. Cl. ................................. 235/462; 235/472
[58] Field of Search ................................. 235/462, 472

[56] References Cited

U.S. PATENT DOCUMENTS

| | | |
|---|---|---|
| 3,691,483 | 9/1972 | Klein . |
| 4,688,884 | 8/1987 | Scifres et al. . |
| 4,706,255 | 11/1987 | Thornton et al. . |
| 4,727,556 | 2/1988 | Burnham et al. . |
| 4,751,711 | 6/1988 | Welch et al. . |
| 4,799,223 | 1/1989 | Streifer et al. . |
| 4,862,467 | 8/1989 | Carter et al. . |
| 5,021,641 | 6/1991 | Swartz et al. . |
| 5,021,643 | 6/1991 | Baciak . |
| 5,050,173 | 9/1991 | Hughes . |
| 5,084,882 | 1/1992 | Hughes . |
| 5,124,537 | 6/1992 | Chandler et al. . |
| 5,177,346 | 1/1993 | Chisholm ...................... 235/462 |
| 5,258,605 | 11/1993 | Metlitsky et al. .............. 235/462 |
| 5,386,107 | 1/1995 | Dvorkis et al. ................ 235/472 |

FOREIGN PATENT DOCUMENTS

| | | |
|---|---|---|
| A 0 495 191 | 7/1992 | European Pat. Off. . |
| A 05 128289 | 5/1993 | Japan . |

OTHER PUBLICATIONS

Hughes and Ghatak, "Phased Array Optical Scanning", Jul. 1, 1979, p. 2098, Applied Optics, vol. 18, No. 13, Feb. 22, 1995.

*Primary Examiner*—Donald T. Hajec
*Assistant Examiner*—Jeffrey R. Filipek
*Attorney, Agent, or Firm*—Suiter & Associates PC

[57] ABSTRACT die based phased array laser scanner which utilizes electronically steerable beams. Beam steering may be utilized to control the scanner such that a phased delay in laser output produces an electronically steerable laser light source. It is possible to then preferentially control the laser light output spatial location since an an array driven at differing phases would constructively interact so as to provide a location of maximum intensity. The phased array laser light may then be utilized to read and decode indicia via a standard laser scanner means.

6 Claims, 2 Drawing Sheets

PHASED ARRAY LASER SCANNER

1. CROSS REFERENCES

The present application claims priority under 35 U.S.C.§ 120 as a continuation of copending application Ser. No. 08/339,972 filed on Nov. 15,1994, now abandoned which is a continuation of USSN 08/053,080 filed 23 Apr. 1993 now abandoned which in turn as a continuation-in-part of USSN 08/023,901 filed 19 Feb. 1993now abandoned. The before mentioned applications are incorporated herein by reference.

2. TECHNICAL FIELD

The present invention relates generally to laser scanners and more particularly to an improved laser scanner which utilizes phased array technology to scan optically readable informations sets or the like.

3. DESCRIPTION OF RELATED ART

Known to the art of reading optically readable information sets are laser scanners and bar code readers. Laser scanners reflect a laser light across the surface of a bar code or the like whereas bar code readers utilize a photosensitive array to produce a digital information set corresponding to optically readable information.

Laser scanners are widely used in many industries, however, devices of this type require manual or mechanical means to move a laser beam over the optically readable information to be read. Bar code readers which utilize photosensitive arrays or CCD's are also widely used in many industries, however, devices of this type have moderate ranges. Thus, it is a primary object of the present invention to provide an improved laser scanner which does not require manual or mechanical steering of the laser beam.

4. SUMMARY OF THE INVENTION

The present invention places several lasers side-by-side on the same substrate, for example, and then guiding the beams together in the same fashion as radar beams are steered in phase array radar systems. There are no moving parts. The phases of the individual antennae that make up the antenna matrix are controlled to direct the beam diffractively.

Wavefront phases are controlled so that they interfere constructively in preferred directions. This feature makes it possible to utilize a multiple junction solid state laser such that it is possible to steer the beam across a code via constructive interference and without moving parts. This may also be utilized with two dimensional code by simply stacking these planar arrays.

The active elements of such a scanner may be quite small since each emitting element need be only microns away from the next. The optimum structure for such an array may be a single multi-legged chip resembling other IC's (it may also be a surface mounted device). In a preferred embodiment some of the driving and phasing devices may be located on the same die as the lazing element. Such a configuration would be beneficial in that it would both enhance compactness and simplify the driver board (a separate driver board may still be required). Additionally, the function of such a board could be incorporated onto the main CPU board in a terminal. A board of this type would necessarily include all processor logic and scanner interfacing. Additionally, in order to enhance ambient light immunity the beam may be modulated.

In an exemplary embodiment the receiver element of the scanner may include a wide field lens. In the simplest approach PIN photodiodes may be utilized because of their speed and sensitivity. In a preferred embodiment the PIN photodiodes may be installed in the front of the terminal protected by a filter. Such filter may then block those wavelengths of light which are not created by the laser sources. Electronically, the signal may be filtered using bandpass filter matching the beam modulation frequency. This would cause the downstream electronics to be selectively blind to all other frequencies which is analogous to acquiring a faint radio signal via tuning. There are many far stronger signals out there but the receiver doesn't hear them. The analogy is robust enough that radio circuit elements could be employed in the task.

The present invention discloses a phased array laser scanner which utilizes electronically steerable beams much like a phased-array radar. Beam steering may be utilized to control a bar code scanner such that a phased delay in laser output produces an electronically steerable laser light source. It is possible to then preferentially control the laser light output spatial location since an array driven at differing phases would constructively interact so as to provide a location of maximum intensity. The phased array laser light may then be read and decoded via standard laser scanner means. We would not perceive a beam emanating from such a scanner but instead we would see a prominent spot of higher intensity traversing the code.

As an example, if we consider a linear array of ten VCSEL lasers spaced evenly at 1 micron, we can calculate some phase values that will have to be imposed to provide such constructive interference. For the purposes of this example, the target will be located at a range of 25.4 millimeters and the spot we wish to illuminate will be 10mm off the centerline of the array. In this case we can rapidly accomplish the math and calculate the phase differences for the lasers in the array. Starting at the end of the array closest to the spot the following phases would apply for such conditions, assuming that the wavelength of the light is 680 nanometers.

| VCSEL | Phase | | | |
|---|---|---|---|---|
| 1 | 1.6857 | * | pi | (radians) |
| 2 | .6229 | * | pi | |
| 3 | 1.5382 | * | pi | |
| 4 | .4754 | * | pi | |
| 5 | 1.3852 | * | pi | |
| 6 | .2950 | * | pi | |
| 7 | 1.2322 | * | pi | |
| 8 | .1201 | * | pi | |
| 9 | 1.0847 | * | pi | |
| 10 | no phase shift | | | |

For each incremental position across the field of view a new set of similarly calculated values would be appropriate. Thus, the idea of a smooth continuous scan across the code is inappropriate. In fact, a scan becomes a sequence of exquisitely closely spaced steps. Spacing of these steps is a function of the degree of resolution required. These phase shift values would conventionally be stored in memory and pulled out as required. It would be reasonable to expect that two thousand steps across a code would be adequate. However, there is nothing magic about this number. It would be expected that the phase shift could be accomplished nearly as rapidly as the data could be read from memory. In order to not acquire spurious data, it would be prudent to disable the photosensor array during the phase transition. A cascade of photosensors may be used to provide a signal of reasonable strength. A filter would be placed over these sensors. Currently no optical elements are being considered as there is really no need to focus an image. It may be desirable to require an optical string to concentrate the light being reflected from the target.

A dual heterojunction laser is set into a die. The active region traverses the die surface and the diode emits from an edge of the die (thus, both die cleave and edge polish are critical). Physically, the optical resonating cavity runs across the die and the cleaved of the die function as mirrors. In the index guided laser the refractive index varies across the cavity. This centers the emission in the cavity by redirecting the nonparallel ray back towards the center in the same way that gradient index lenses operate.

The vertical cavity surface emitting laser is constructed vertically into the die. The process involves a sequence of diffusions and etching processes. The cavity is oriented perpendicularly to the die face. Diodes of this type have several attributes: (1) they do not have the astigmatism associated with other technologies; (2) brightness angle is much more acute and the parallel angle is nearly equal to the perpendicular angel; and (3) the optics needed to collimate the beam created are much less complex. In fact, a microlens for collimation may be mounted on the die, making the addition of external optics unnecessary. Additionally, such a die could be diminutive enough that it could be directly mounted on a moving surface like a mylar leaf spring.

This fabrication technique lends itself readily to building multiple surface emitters in arrays. Building arrays of lasers based upon the other technologies is challenging. Thus, phased arrays of laser diodes may be more easily constructed using a vertical cavity surface emitter.

Phased array lasers are currently known in the art and are used to increase output. The present invention is the first to suggest and teach means for using a die based array of phased lasers to read and decode optically readable information sets such as bar codes, portable data files, or the like.

Laser diodes do not send out tightly controlled well collimated zero divergence beams. In fact, without external collimation the output of a laser diode is elliptical in cross section. Beam divergences are quite large so a laser diode's output can be considered to be sort of elliptical cone. Output divergence angles are specified for the vertical and horizontal planes and they are different in both planes. This may be seen in the elliptical beam cross sections. These planes are referenced as being either parallel or perpendicular to the junction.

To further complicate things the source for the vertical dispersion and the source for the horizontal dispersion seems to be at two different points. This is the measure of the astigmatism of the laser. A lens system is always used to collimate this beam into a usable beam of cylindrical cross section. The lens must redirect rapidly diverging rays that are diverging at different rates in planes mutually perpendicular.

The Sony laser diode SLD151 U has a perpendicular dispersion angle to the half brightness point of between 30 and 35 degrees. It has a parallel dispersion angle to the half brightness point between 2 and 15 degrees. The astigmatism, as identified as the difference in the positions of the two apex angles for this family of diodes is between 15 and 35 μm.

These diodes are generally specified as having more than one simultaneous wavelength, they are not strictly monochromatic. Generally though, one wavelength tends to dominate the output. This is somewhat analogous to standing waves in an organ pipe (there are other standing waves that are possible in an organ pipe, than the one that exactly fits the length of the pipe). The diameter and cross sectional area of the pipe allow other paths that are slightly longer. For example, this is why square pipes in Baroque organs made of wood have different spectra than round pipes in other organs. The spectra show wavelengths that appear at discrete intervals. Any light generated that does not match one of the preferred wavelengths interfere with itself destructively within the die.

5. BRIEF DESCRIPTION OF THE DRAWINGS

6. DETAILED DESCRIPTION OF THE INVENTION

Figure 1:
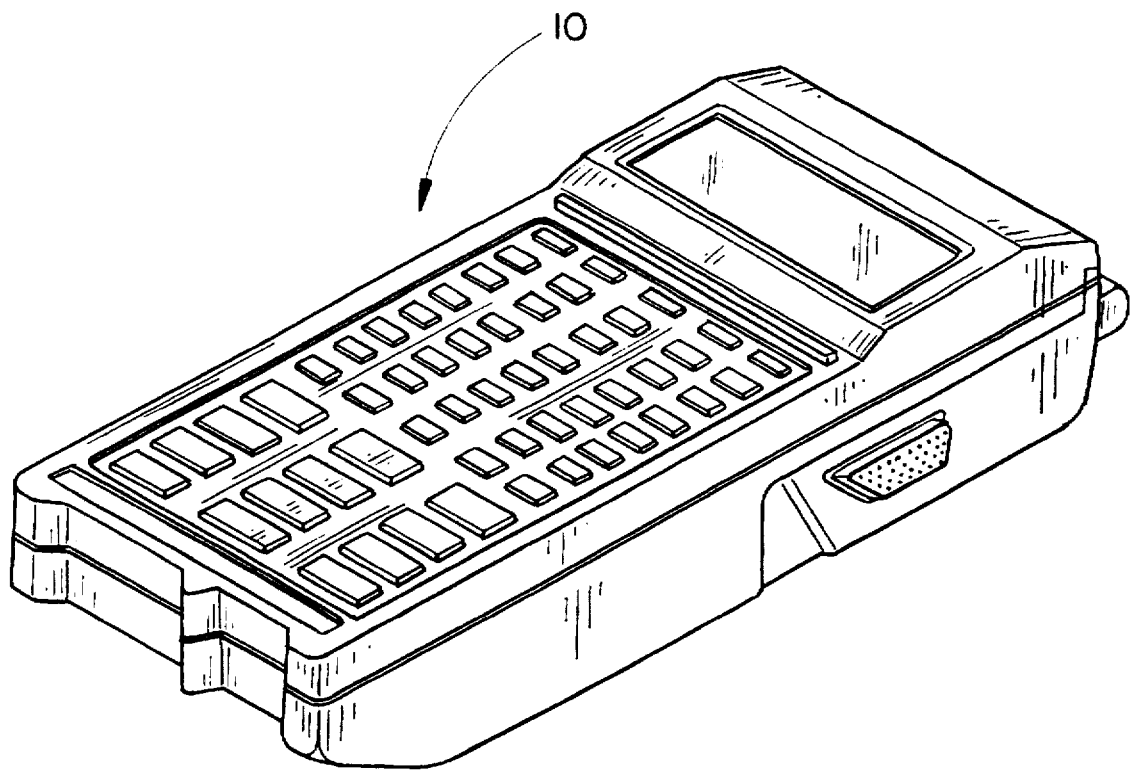
FIG. 1 is a perspective view of a hand-held data terminal with a phased array laser scanner for reading optically readable information sets.
Figure 2:
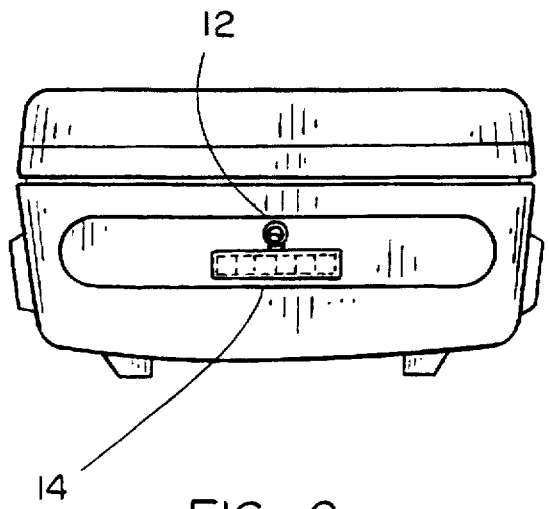
FIG. 2 is a front elevational view of the hand-held data terminal of FIG. 1 illustrating the phased array laser source 14 and the photodiode sensor array 12.
Figure 3:
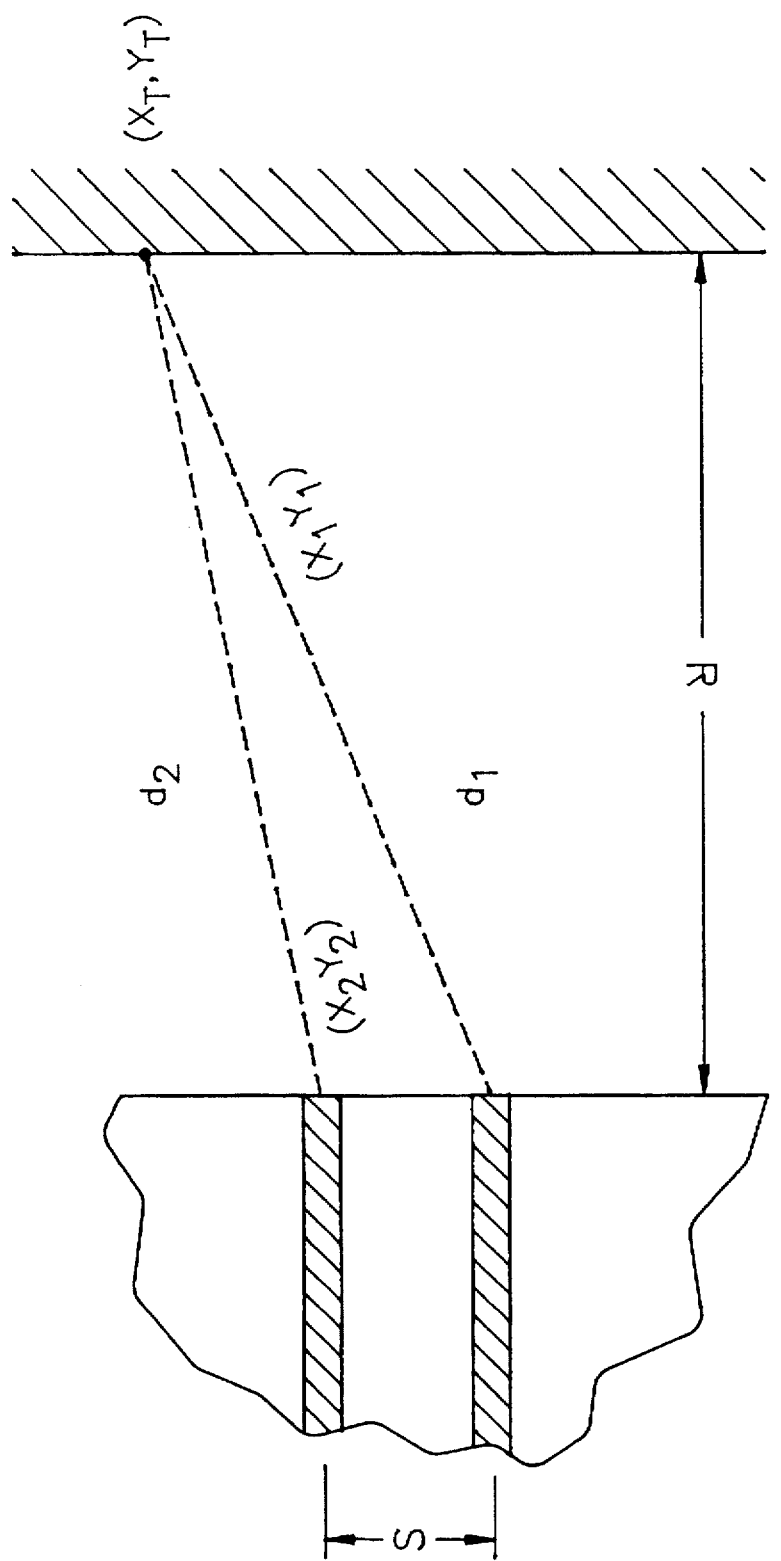
FIG. 3 is a diagrammatic illustration showing the relationship of laser element to laser element spacing to laser array to target distances.

Turning first to FIG. 3 wherein the light output is at a single wavelength and all sources are phased identically. A bright spot will appear at $Y_T$.F The beams interfere constructively at that point. Then the distances $d_1$ and $d_2$ must both be integral multiples of the wavelength $\lambda$.

$$d_1 = \sqrt{(Y_T - (Y_2 + 3))^2 + K^2}$$

$$d_2 = \sqrt{(Y_T - Y_2)^2 + R^2}$$

and (INT ($d_2 / \lambda$)) *$\lambda$=$d_2$ (INT($d_1/\lambda$))*$\lambda$=$d_1$.

INT is the BASIC INTEGER function that discards the fractional portion of a real number.

Only two lazing regions have been shown for simplicity. If more regions are involved, as would be the case in such a diode laser array as contemplated, then the constructive interferences at $Y_T$ could be further enhanced and the side lobes occurring at other places on the target could be minimized by their influence.

When the case which occurs at $f_1 \neq f_2$ tight control over beam position may be achieved. In this case the distances need no longer be integral multiples of the wavelengths. Here it is only necessary to add non-integral pieces of wavelengths to shift the region of constructive interferences.

Beam steering via phase laser arrays

All active laser elements must be monochromatic. All active laser elements in the array must radiate homogeneously. Their polarizations must be identical; as must their wavelengths. Then with the following definitions:

S=laser element to laser element spacing;

r=laser array to target distances;

$Y_i$=individual location of each laser center line (S=$Y_{(i,ii,iii...n)}-Y_i$);

$Y_T$ =target point location;

$\phi_i$ ; =phase angle induced in individual laser element located at $Y_i$;

$\lambda$= wavelength of radiated laser light, ($\lambda=\lambda_1=\lambda_2=\ldots=\lambda_N$) identical for all radiating elements;

N= the number of elements in the array;

$W_i$=weighting function applied as an intensity adjustment (if $W_i=0$ for some value i, then the element at $Y_i$ is disabled and $W_i$ may be used to force output intensity similarly across the array);

$d_i$=distance from target point to radiating element at $Y_i$.

$$d_i = \sqrt{(Y_T - Y_i)^2 + r^2}$$

The governing equation for all such arrays becomes:

$$I_T = \sum_{i=1}^{N} (((d_i)_{MOD\lambda} * 2\Pi) + \phi i) W_i$$

It is the cumulative intensity at a target point $Y_T$. The MOD $\lambda$OPERATION divides $d_i$ by $\lambda$ and retains the fractional residue. Multiplication by $2\pi$ converts this distance residue to a phase angle. Any phase angle $\phi$ is then added to the result and this final result is adjusted by the weighting function. In systems where the phase angle is uncontrollable $100_{i=}0$ for all i. This then would represent the entire resultant output from the laser array in comparing all cumulative constructive and destructive interferences. Additionally, $\phi_i$ and $W_i$ may be used to precisely control beam position. Wi may also be used to control side lobe amplitude reduction. Since this type of beams steering makes use of interferences, side lobes may appear on the target. Their effect can be reduced by properly adjusting $\phi_i$ and $W_i$ and variation in S may be accommodated by the calculation of d.

The active elements of this scanner could be placed within the front portion of the case of a terminal such as the NORAND RT 1100 (with minor modifications). The driver board may be inserted into this module if the depth was increased to provide component clearance. The interface to the terminal would be handled in the same fashion as all other current integrated scanners. The connections are provided on the CPU board for this. Overall, the forward facing scanning elements could occupy less than half of a square inch and have a depth of less than two tenths. It's appearance would be rectangular with the sensor in one portion of the rectangle and the source in the other half. The long axis of the rectangle would be oriented in the vertical with either the source or sensor above. This area could be split into two portions for aesthetics but would be centrally located on the module.

I claim:

1. A phased array laser scanner for reading optically readable information sets, comprising at least, two phased array lasers for producing a moving light beam spot over optically readable information sets, said at least two phased array lasers providing direct illumination of an optically readable information set by driving said lasers at differing phases to cause constructive interference so as to provide a location of maximum interference; and reading sensor means for converting the reflected light image of said moving light beam spot over an optically readable information set into an electrical signal.

2. The phased array laser scanner for reading optically readable information sets of claim 1 further including a wide field lens.

3. The phased array laser scanner for reading optically readable information sets of claim I further including a filter for blocking wavelengths of light not created by said die based phased array lasers.

4. The phased array laser scanner for reading optically readable information sets of claim 3 wherein said filter is a bandpass filter.

5. A hand-held data collection terminal, comprising:

a housing having an area thereon sensitive to physical contact for communicating commands and a display for displaying information.

a phased array laser scanner for producing a moving light beam spot over optically readable information sets, said lasers providing direct illumination of an optically readable information set by driving said lasers at differing phases to cause constructive interference so as to provide a location of maximum interference and reading sensor means for converting the reflected light image of said moving light beam spot over an optically readable information set into an electrical signal.

6. A hand-held data input scanner for reading an optically readable information set including bar code labels, data input scanner comprising:

(a) an array of semiconductor lazing elements, each of the semiconductor lazing elements being capable of emitting a laser beam having a phase angle, the emitted laser beams being directed toward the optically readable information set resulting in light reflected therefrom, the emitted laser beams providing direct illumination of an optically readable information set;

(b) operably connected to said array of semiconductor lazing elements for controlling the emitted beams such that a point of constructive interference of the emitted beams thereby scans the optically readable information set;

(c) wherein said control means adjusts the phase angles of the emitted laser beams according to the distance between said array and the optically readable information set; and (d) reading sensor means for converting the reflected light into an electrical signal.

* * * * *